US008111517B2

(12) United States Patent
Chang

(10) Patent No.: US 8,111,517 B2
(45) Date of Patent: Feb. 7, 2012

(54) HEAT SINK ASSEMBLY, PORTABLE ELECTRONIC DEVICE USING SAME AND WIRELESS MODEM USING THE HEAT SINK ASSEMBLY

(75) Inventor: Cheng-Lung Chang, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 126 days.

(21) Appl. No.: 12/791,053

(22) Filed: Jun. 1, 2010

(65) Prior Publication Data
US 2011/0128705 A1    Jun. 2, 2011

(30) Foreign Application Priority Data

Nov. 30, 2009   (TW) ................................. 98140762

(51) Int. Cl.
*H05K 7/20* (2006.01)
(52) U.S. Cl. ....... 361/719; 361/704; 361/707; 165/80.3; 165/185
(58) Field of Classification Search .................. None
See application file for complete search history.

(56) References Cited

U.S. PATENT DOCUMENTS

| 5,161,087 | A  | * | 11/1992 | Frankeny et al. | ............. | 361/702 |
| 6,278,610 | B1 | * | 8/2001 | Yasufuku et al. | ............. | 361/704 |
| 7,177,156 | B2 | * | 2/2007 | Yatskov et al. | ............... | 361/709 |
| 7,262,964 | B1 | * | 8/2007 | Barsun | ........................... | 361/695 |
| 7,773,383 | B2 | * | 8/2010 | Liang | ............................. | 361/719 |
| 2002/0134532 | A1 | * | 9/2002 | Hirano et al. | ................. | 165/80.3 |
| 2009/0139690 | A1 | * | 6/2009 | Maerz et al. | ................. | 165/80.2 |

* cited by examiner

*Primary Examiner* — Boris Chervinsky
(74) *Attorney, Agent, or Firm* — Altis Law Group, Inc.

(57) ABSTRACT

A heat sink assembly, a portable electronic device using the same and a wireless modem using the heat sink assembly are disclosed. The heat sink assembly assembled within the portable electronic for dissipating the heat source generated within the portable electronic device to the outside. The heat sink assembly includes a frame, a cover and an absorbing sheet. The frame includes a through opening formed and surrounded thereby. The cover foldably or bendably extends outwardly from one side of the frame and is configured to be alternatively accommodated within the opening of the frame for covering the opening or forming an angle relative to the frame. The absorbing sheet is fixedly covered on the other side of the frame opposite to the cover.

16 Claims, 5 Drawing Sheets

HEAT SINK ASSEMBLY, PORTABLE ELECTRONIC DEVICE USING SAME AND WIRELESS MODEM USING THE HEAT SINK ASSEMBLY

BACKGROUND

1. Technical Field

This exemplary disclosure generally relates to a heat sink assembly, and particularly to a heat sink assembly, a portable electronic device using the same and a wireless modem using the heat sink assembly.

2. Description of Related Art

Heat sinks are to be found in electronic devices such as computers, projectors, servers, and the like, for removing heat generated by heat-generating electronic components such as central processing units (CPUs) etc., to ensure that the electronic components function properly and reliably. Portable electronic devices have become smaller and more compact. Effectively dissipating heat becomes critical to the work life of internal electronic components. However, the large sized heat sinks needed to dissipate the heat in the compact spaces, are not compatible with the requirements for compactness.

Therefore, there is room for improvement within the art

BRIEF DESCRIPTION OF THE DRAWINGS

Many aspects of the exemplary heat sink assembly, portable electronic device using the same and wireless modem using the heat sink assembly can be better understood with reference to the following drawings. The components in the various drawings are not necessarily drawn to scale, the emphasis instead being placed upon clearly illustrating the principles of the exemplary heat sink assembly, portable electronic device using the same and wireless modem using the heat sink assembly. Moreover, in the drawings, like reference numerals designate corresponding parts throughout the diagrams.

DETAILED DESCRIPTION

In this exemplary embodiment, the heat sink assembly is applied to a wireless modem or a wireless network card. The wireless modem or wireless network card described herein is a representation of the type of small sized portable electronic device that may benefit from the exemplary embodiment. However, it is to be understood that the exemplary embodiment may be applied to any type of small sized hand-held or portable electronic device including, but not limited to, the following devices: mobile telephones, personal digital assistants, wireless modems, and the like. Accordingly, any reference herein to the wireless network card or the wireless modem should also be considered to apply equally to other small sized portable electronic devices.

Figure 1:
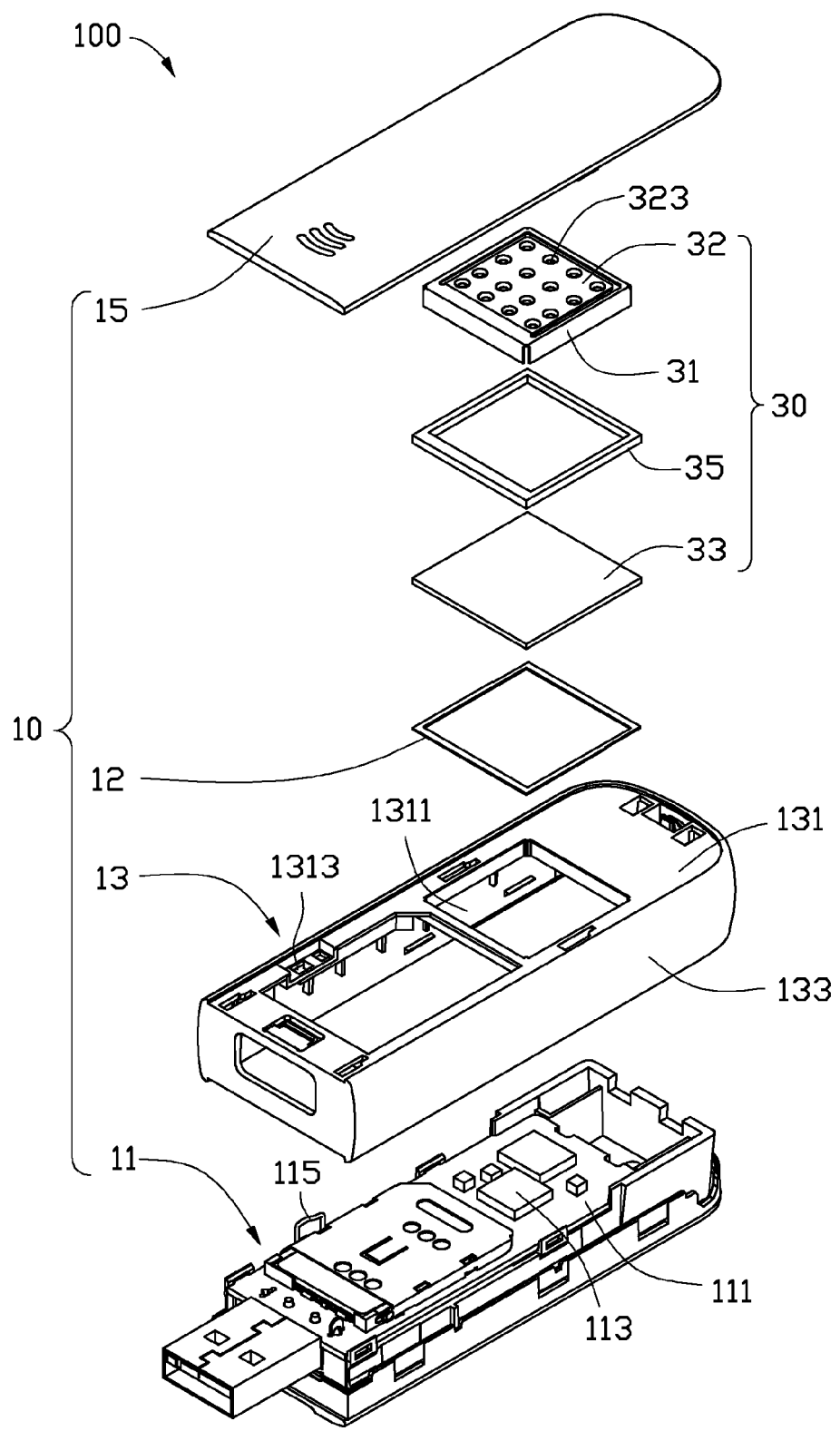
FIG. 1 shows an exploded perspective view of a portable electronic device with a heat sink assembly assembled therein, in accordance with an exemplary embodiment.

FIG. 1 shows an exemplary exploded perspective view of a wireless modem 100 including a main body 10 and a heat sink assembly 30 assembled within the main body 10. The main body 10 includes a base body 11, a conductor 12, a housing 13 and an upper shell 15. The base body 11 is detachably assembled with the housing 13 and partially accommodated within the housing 13. The base body 11 includes a circuit board 111 mounted thereon. A plurality of electronic components 113 including heat-generating electronic components are disposed on the circuit board 111. A wire 115 is fixed to one side of the base body 11.

The conductor 12 is made of heat conducting material such as copper for dissipating the heat generated by the heat-generating electronic components 113. The conductor 12 may be substantially rectangular including four conducting pieces cooperatively forming the conductor. In this exemplary embodiment, the conductor 12 is disposed on the circuit board 111 by surface mount technology (SMT) and surrounds the heat-generating electronic components 113 therein.

The housing 13 is a substantially hollow cavity including an upper wall 131 and a peripheral wall 133. The peripheral wall 133 extends from the peripheral edge of the upper wall 131 and cooperatively forms an accommodating cavity 135 with the upper wall 131. The accommodating cavity 135 has substantially the same shape and size as the base body 11 for accommodating the base body 11 therein. An assembling hole 1311 is defined through the upper wall 131 and configured for exposing the heat sink assembly 30. Two locking holes 1313 are defined through the upper wall 131 adjacent to the peripheral wall 133 corresponding to the wire 115 of the base body 11 and configured to be passed through by wire 115 to connect with the upper shell 15.

Figure 2:
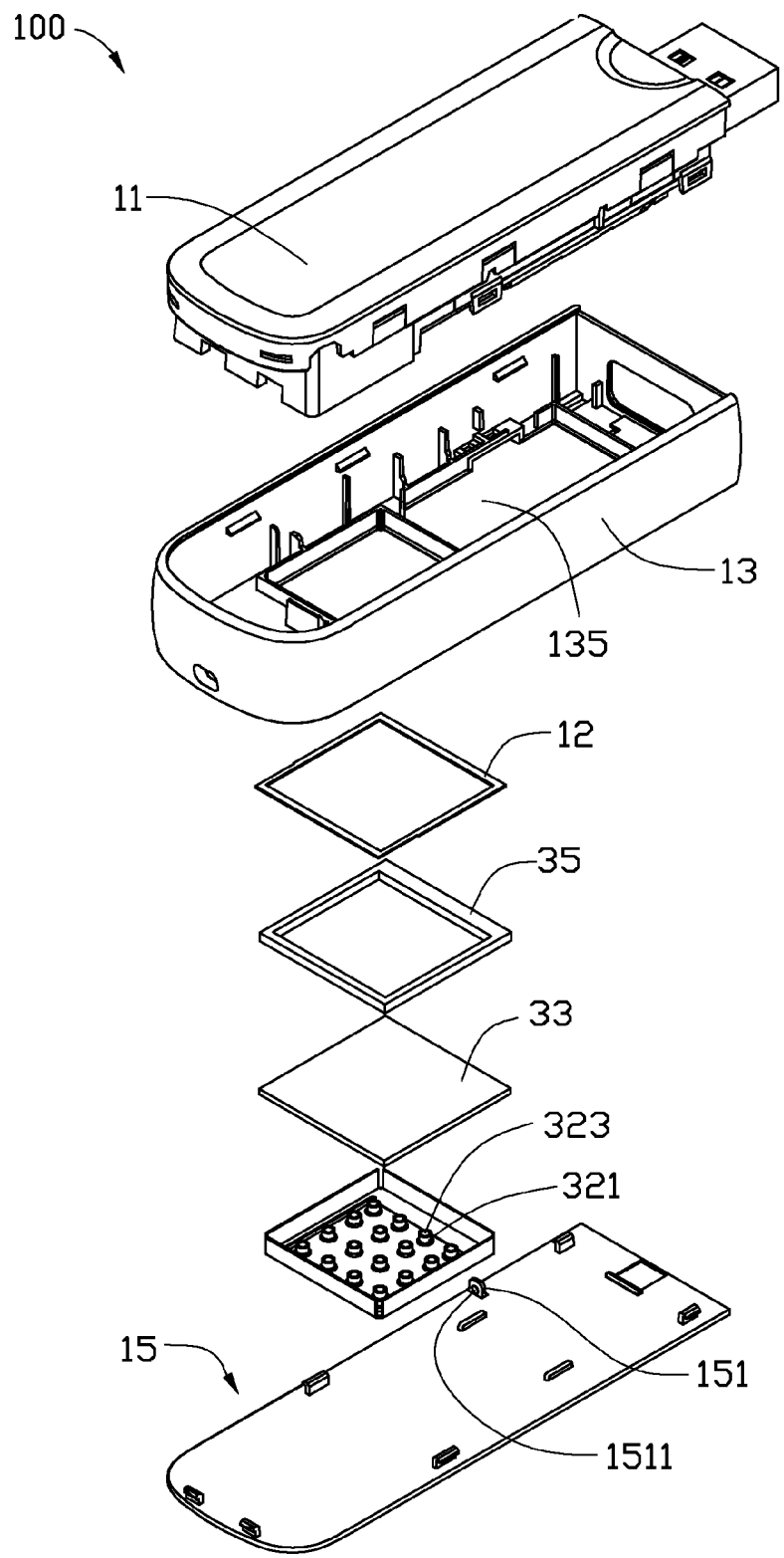
FIG. 2 is similar to FIG. 1, but viewed from another aspect.
Figure 3:
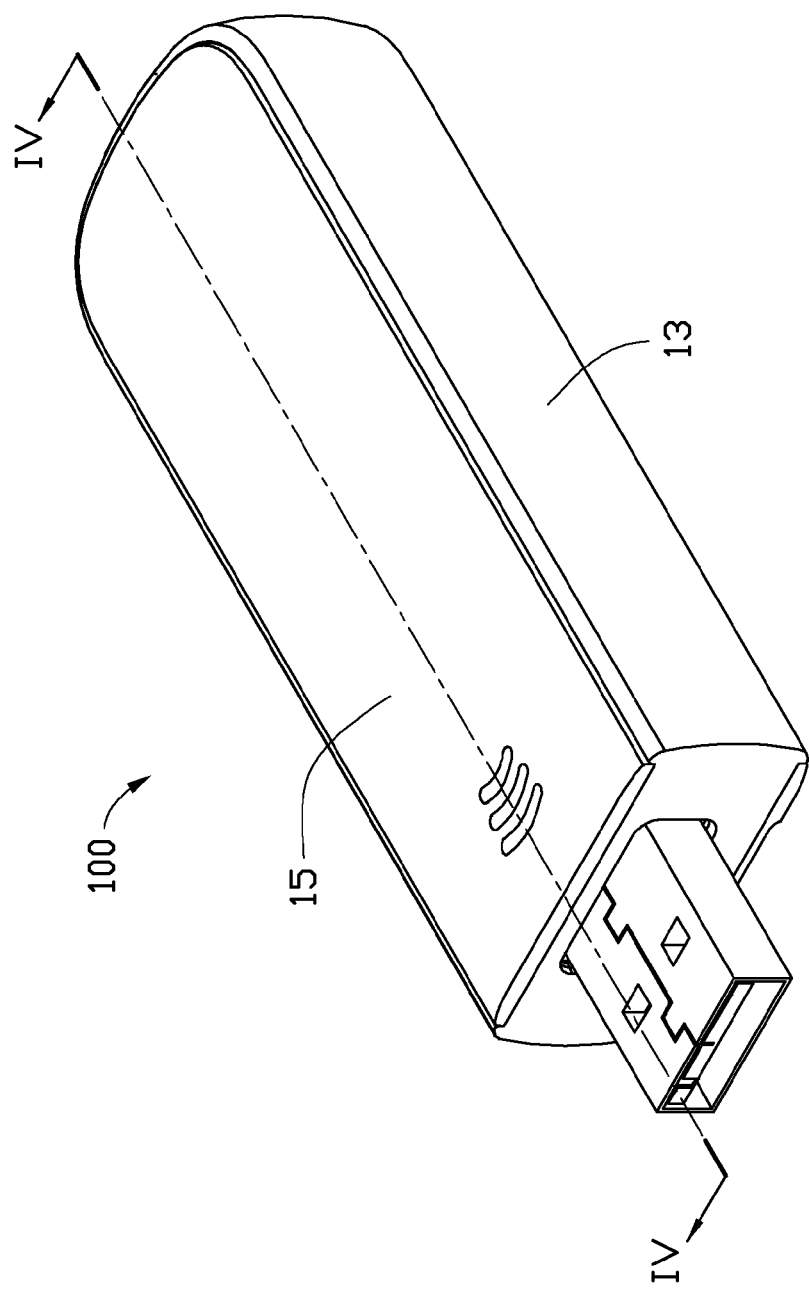
FIG. 3 shows an assembled perspective view of the portable electronic device.

Also referring to FIG. 2, the upper shell 15 has substantially the same shape and size as the upper wall 131 of the housing 13 and can be detachably mounted on the upper wall 131 of the housing 13. A lug block 151 extends from one side of the upper shell 15 corresponding to the locking hole 1313 of the housing 13, so that the wire 115 can pass through the corresponding locking holes 1313 of the housing 13 and engage with the lug block 151 of the upper shell 15 to prevent the upper shell 15 from separating from the base body 11.

The heat sink assembly 30 is disposed above the heat-generating electronic components 113 of the circuit board 111 and tightly mounted on and rests against the corresponding conductor 12 for dissipating the heat source generated by the electronic components 113 to the outside. The heat sink assembly 30 includes a frame 31, a cover 32, an absorbing sheet 33 and an adhesive 35. The frame 31 has substantially the same shape and size as the conductor 12 and thereby forming a surrounding through opening 315. The cover 32 foldably or bendably extends outwardly from one side of the frame 31 and forms an angle relative to the frame 31. The cover 32 can be folded or bent to cover and be accommodated within the opening 315 of the frame 31. A plurality of heat sinking posts 321 are formed on one surface of the cover 32 toward the opening 315 side for increasing the heat dissipating area of the heat sink assembly 30. Each heat sinking post 321 defines a heat sinking hole 323 therethrough to communicate with the opposite other side surface of the cover 32.

The absorbing sheet 33 can absorb and transform electromagnetic interference energy and noise into heat energy. The absorbing sheet 33 is fixedly covered on the other side of the frame 31 opposite to the cover 32 by means of the adhesive 35 and sandwiched between the frame 31 and the conductor 12. The adhesive 35 can be made of a heat conducting material.

Figure 4:
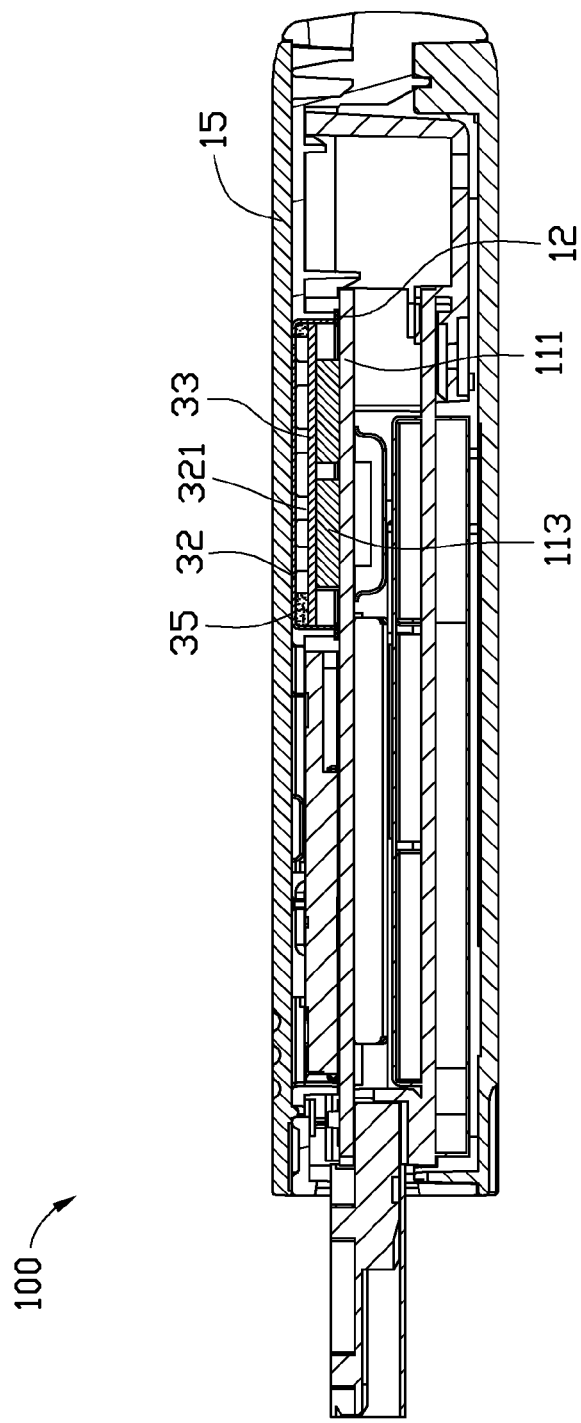
FIG. 4 shows a cross sectional view of the portable electronic device taken along line IV-IV shown in FIG. 3, in accordance with an exemplary embodiment.

Also referring to FIG. 4, in this exemplary embodiment, the frame 31 and the cover 32 are made of heat conducting material such as copper, aluminum, and iron. The heat sinking assembly 30 is fixedly mounted to the housing 13 and accommodated within the corresponding assembling hole 1311. As the upper shell 15 is mounted on the housing 13, the upper shell 15 resists against the cover 32 to cover the opening 315, such that the frame 31, the cover 32 and the absorbing sheet 33 cooperatively formed to shield the electromagnetic interference generated within the wireless modem 100. The heat generated by the heat-generating electronic components 113 of the circuit board 111 is transmitted to the frame 31 and cover 32, by means of the conductor 12 surrounding thereby. Then, the heat is dissipated to the outside of the wireless modem 100.

Figure 5:
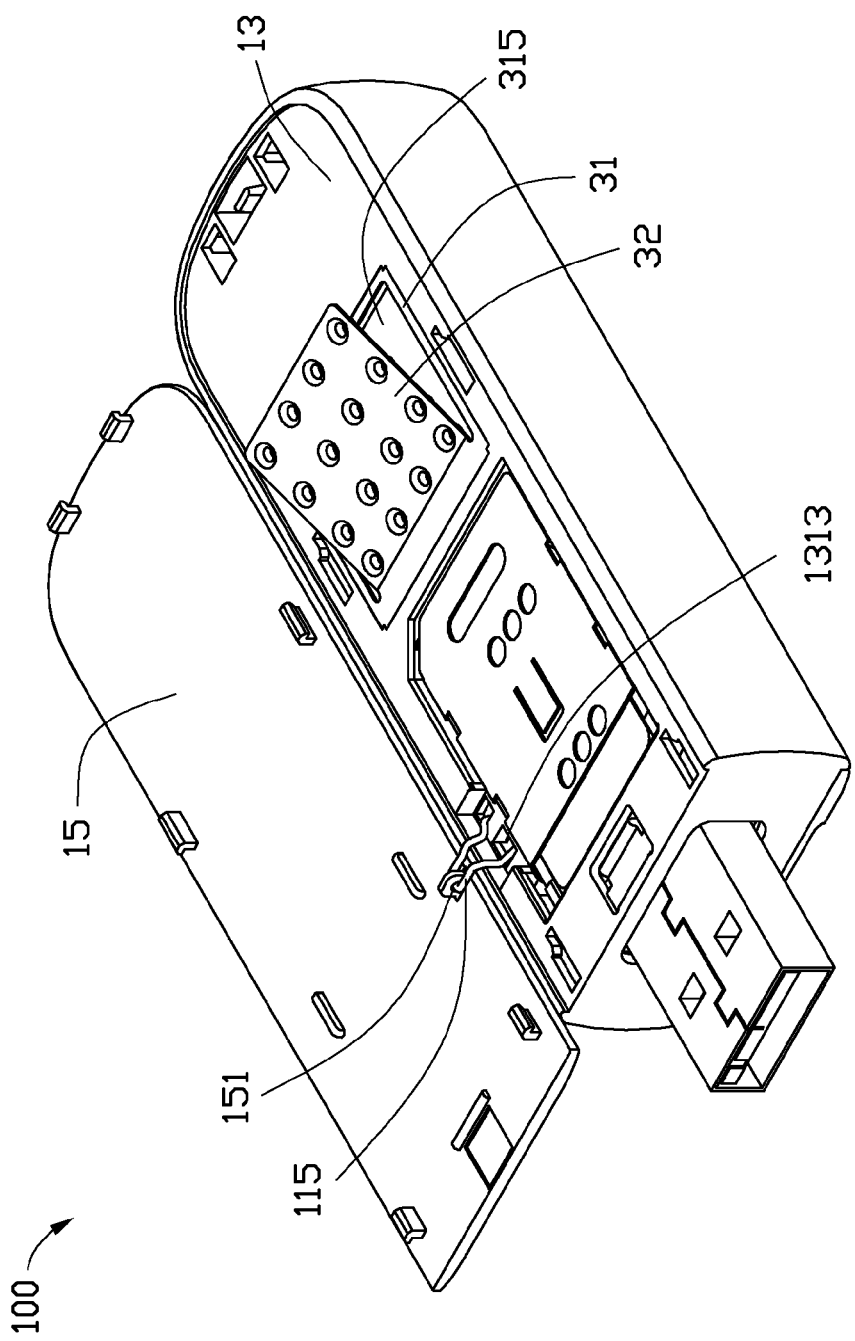
FIG. 5 shows another assembled perspective view of the portable electronic device, wherein, the bear cover of the portable electronic device is in an opened state.

Also referring to FIG. 5, when the upper shell 15 is opened relative to the housing 13, the cover 32 can open to form an angle relative to the upper wall 131 of the housing and expose from the opening 315 of the frame 31, such that the heat generated by the heat-generating electronic components 113 of the circuit board 111 can be dissipated to the outside of the wireless modem 100 directly. Meanwhile, the frame 31 and the absorbing sheet 33 cooperatively function as a shielding case to shield the electromagnetic interference.

It is to be understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary disclosure to the full extent indicated by the broad general meaning of the terms in which the appended claims are expressed.

What is claimed is:

1. A heat sink assembly, comprising:
   a frame including a through opening formed and surrounded thereby;
   a cover foldably or bendably extending outwardly from one side of the frame and being configured to be alternatively accommodated within the opening of the frame for covering the opening or forming an angle relative to the frame; and
   an absorbing sheet fixedly covered on the other side of the frame opposite to the cover.

2. The heat sink assembly as claimed in claim 1, wherein the heat sink assembly further includes an adhesive, the adhesive adheres the absorbing sheet to the frame opposite to the cover side of the frame fixedly.

3. The heat sink assembly as claimed in claim 2, wherein the adhesive is made of a heat conducting material.

4. The heat sink assembly as claimed in claim 1, wherein the cover includes a plurality of heat sinking posts disposed on one surface of the cover toward the opening side, each heat sinking post defines a heat sinking hole therethrough to communicate with the opposite other side surface of the cover.

5. The heat sink assembly as claimed in claim 4, wherein the frame and the cover are made of heat conducting material.

6. The heat sink assembly as claimed in claim 5, wherein the frame and the cover are made of copper, aluminum or iron.

7. A portable electronic device, comprising:
   a circuit board incorporating a plurality of electronic components including heat-generating electronic components disposed thereon; and
   a heat sink assembly disposed above the heat-generating electronic components of the circuit board for dissipating the heat source generated by the electronic components to the outside;
   wherein, the heat sink assembly comprising:
   a frame mounted on the circuit board surrounding the heat-generating electronic components therein, the frame including a through opening formed and surrounded thereby; and
   a cover foldably or bendably extending outwardly from one side of the frame and being configured to be alternatively accommodated within the opening of the frame for covering the opening or forming an angle relative to the frame.

8. The portable electronic device as claimed in claim 7, wherein the heat sink assembly further includes an absorbing sheet fixedly covered on the other side of the frame opposite to the cover by means of an adhesive.

9. The portable electronic device as claimed in claim 8, wherein the portable electronic device further includes a substantially frame shaped conductor mounted on the circuit board, the conductor surrounds the heat-generating electronic components therein for dissipating the heat generated by the heat-generating electronic components, the absorbing sheet is sandwiched between the conductor and the frame.

10. The portable electronic device as claimed in claim 7, wherein the cover includes a plurality of heat sinking posts disposed on one surface of the cover toward the opening side, each heat sinking post defines a heat sinking hole therethrough to communicate with the opposite other side surface of the cover.

11. The portable electronic device as claimed in claim 9, wherein the conductor is made of copper and is disposed on the circuit board by surface mounted technology.

12. The portable electronic device as claimed in claim 9, wherein the portable electronic device further includes a base body and a housing detachably assembled with the base body, the circuit board mounted on the base body, the housing includes an upper wall and a peripheral wall, the upper wall includes an assembling hole defined therethrough, the heat sink assembly exposes from the assembling hole.

13. The portable electronic device as claimed in claim 12, wherein the frame of the heat sinking assembly is fixedly mounted to the housing.

14. The portable electronic device as claimed in claim 12, wherein the housing further includes two locking holes defined through the upper wall adjacent to the peripheral wall; the portable electronic device further includes a wire fixed to the base body and configured to pass through the two locking holes to assemble the housing and the base body together.

15. The portable electronic device as claimed in claim 14, wherein the portable electronic device further includes an upper shell detachably mounted on the upper wall of the housing, the upper wall includes a lug block extending adjacent from one side thereof corresponding to the locking hole of the housing, the wire passes through the corresponding locking holes and fixed to the lug block of the upper shell to prevent separation of the upper shell and the base body.

16. A wireless modem comprising:
   a circuit board incorporating a plurality of electronic components including heat-generating electronic components disposed thereon; and
   a heat sink assembly disposed above the heat-generating electronic components of the circuit board for dissipating the heat source generated by the electronic components to the outside;

wherein, the heat sink assembly comprising:
  a frame mounted on the circuit board surrounding the heat-generating electronic components therein, the frame including a through opening formed and surrounded thereby; and
  a cover bendably extending outwardly from one side of the frame and being configured to be alternatively accommodated within the opening of the frame for covering the opening or forming an angle relative to the frame.

* * * * *